United States Patent
Kim et al.

(10) Patent No.: US 7,633,318 B2
(45) Date of Patent: Dec. 15, 2009

(54) DATA RECEIVER OF SEMICONDUCTOR INTEGRATED CIRCUIT AND METHOD FOR CONTROLLING THE SAME

(75) Inventors: Hyung-Soo Kim, Ichon (KR); Kun-Woo Park, Ichon (KR); Yong-Ju Kim, Ichon (KR); Hee-Woong Song, Ichon (KR); Ic-Su Oh, Ichon (KR); Tae-Jin Hwang, Ichon (KR); Hae-Rang Choi, Ichon (KR); Ji-Wang Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/176,215

(22) Filed: Jul. 18, 2008

(65) Prior Publication Data

US 2009/0128192 A1 May 21, 2009

(30) Foreign Application Priority Data

Nov. 19, 2007 (KR) .................. 10-2007-0117942

(51) Int. Cl.
*G01R 19/00* (2006.01)
*H03H 7/30* (2006.01)

(52) U.S. Cl. ............................ 327/54; 327/57; 375/233

(58) Field of Classification Search ............... 327/54, 327/57, 233
See application file for complete search history.

(56) References Cited

U.S. PATENT DOCUMENTS

| | | | |
|---|---|---|---|
| 7,206,341 B2 * | 4/2007 | Steinbach | 375/229 |
| 7,233,173 B1 | 6/2007 | Lewicki et al. | |
| 7,433,401 B1 * | 10/2008 | Roo | 375/233 |

FOREIGN PATENT DOCUMENTS

| | | |
|---|---|---|
| JP | 2005-348021 | 12/2005 |
| JP | 2007-142811 | 6/2007 |
| KR | 1020030006823 | 1/2003 |
| KR | 1020060109806 | 10/2006 |

* cited by examiner

*Primary Examiner*—Kenneth B. Wells
(74) *Attorney, Agent, or Firm*—Baker & McKenzie LLP

(57) ABSTRACT

A data receiver of a semiconductor integrated circuit includes an amplifier that outputs an amplified signal by detecting and amplifying received data using equalization function according to feedback data, a detecting unit that detects a period when data is not received in the amplifier and outputs a detecting signal, and an equalization function control unit that stops the equalization function of the amplifier in response to the detecting signal.

16 Claims, 4 Drawing Sheets

DATA RECEIVER OF SEMICONDUCTOR INTEGRATED CIRCUIT AND METHOD FOR CONTROLLING THE SAME

CROSS-REFERENCES TO RELATED APPLICATION

This application claims the benefit under 35 U.S.C 119(a) of Korean application number 10-2007-0117942, filed on Nov. 19, 2007, which is incorporated herein in its entirety by reference as if set forth in full.

BACKGROUND

1. Technical Field

The embodiments described herein relate to a semiconductor integrated circuit, particularly a data receiver of a semiconductor integrated circuit and a method for controlling the data receiver.

2. Related Art

A conventional data receiver of a semiconductor integrated circuit, as shown in FIG. 1, includes termination resistors R1_T, R2_T connected between a terminal of a power voltage VDD and a terminal of a ground voltage VSS, an amplifier 10, a delay chain 20, and a latch 30.

The amplifier 10 can amplify received data on the basis of a reference voltage VREF received from the outside and output the amplified signal "AMP_OUT". The amplifier 10 can include a circuit for an equalization function. An equalization function is a technology for improving the operational margin of the data receiver that operates at a high speed by using past date to detect present data.

The amplifier 10 uses feedback data EQ– and EQ+ as past data. One of the feedback data, EQ– or EQ+, has the same logic value as the amplified signal "AMP_OUT" and the other feedback data has an opposite logic value. The delay chain 20 can delay and transmit the amplified signal "AMP_OUT" to the latch 30. The latch 30 can latch the amplified signal "AMP_OUT" based on the clock signal "CLK".

A conventional data receiver of a semiconductor integrated circuit can use the equalization function. The amplified signal "AMP_OUT", output from the amplifier 10, can be maintained at high impedance state High-Z by the termination resistors R1_T, R2_T in a period in which data is received. The high impedance state can have a level of (VDD–VSS)/2, i.e. an inaccurate logic level that may be recognized as a high level or a low level.

The high-impedance amplified signal "AMP_OUT", having an inaccurate logic level in the period when data is not received, can be fed-back using the feedback data to the amplifier 10 through the delay chain 20. Accordingly, since the feedback data can have an inaccurate logic level in the period when data is not received, the amplifier 10 may not accurately detect data received after a high impedance level.

SUMMARY

A data receiver of a semiconductor integrated circuit that can accurately detect data received after a high impedance state where data is not received, as well as data that is normally received, and a method for controlling the data receiver are described herein.

In one aspect, a data receiver of a semiconductor integrated circuit can comprise an amplifier that can output an amplified signal by detecting and amplifying received data using equalization function according to feedback data, a detecting unit that can detect a period when data is not received in the amplifier and output a detecting signal, and an equalization function control unit that can stop the equalization function of the amplifier in response to the detecting signal.

One method for controlling a data receiver of a semiconductor integrated circuit can include an amplifier that can output an amplified signal by detecting and amplifying received data using an equalization function according to feedback data. The method can include detecting a time period when data is not received by the amplifier, and controlling an equalization function of the amplifier to stop in the time period in which data is not received by the amplifier.

The data receiver of a semiconductor integrated circuit and a method for controlling the data receiver can have the following advantages: First, it is possible to accurately detect data that is received after high impedance state as well as normal data. Second, it is possible to achieve a data receiver having only the advantages of an equalization function because the equalization function is separately performed for a high impedance state and for other states.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
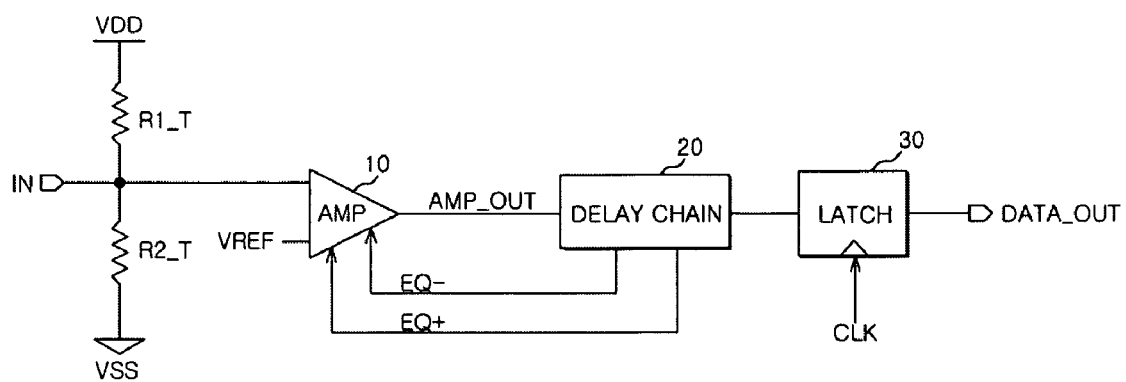
FIG. 1 a diagram illustrating the configuration of a conventional data receiver of a semiconductor integrated circuit.
Figure 2:
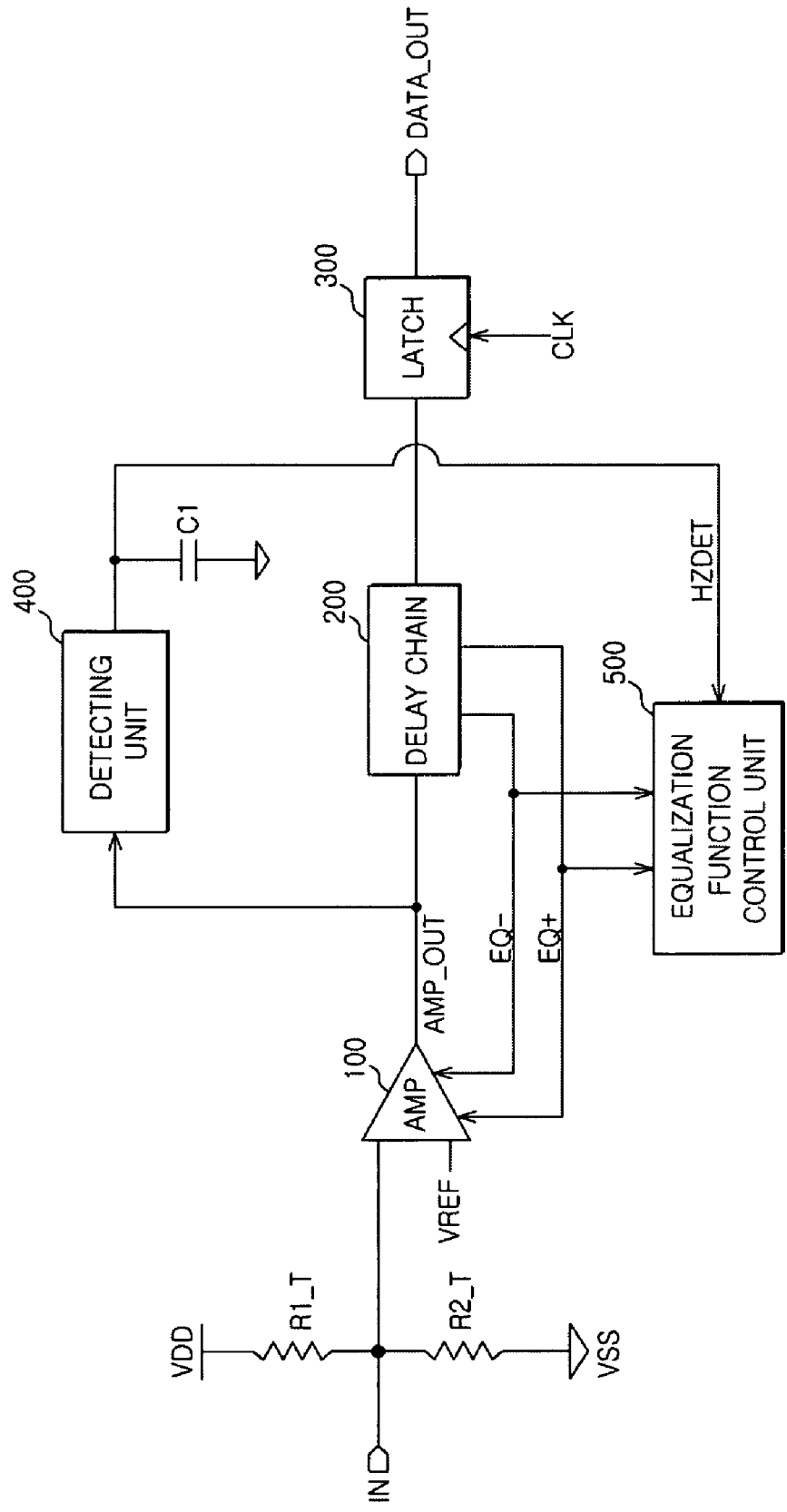
FIG. 2 is a diagram illustrating the configuration of a data receiver of a semiconductor integrated circuit according to one embodiment.

The embodiments described herein relate to a data receiver of a semiconductor integrated circuit and a method for controlling the data receiver. FIG. 2 is a diagram illustrating the configuration of a data receiver 101 of a semiconductor integrated circuit according to one embodiment. Referring to FIG. 2, the data receiver 101 can include resistors R1_T, R2_T, an amplifier 100, a delay chain 200, a latch 300, a detecting unit 400, a capacitor C1, and an equalization function control unit 500.

The configuration of the termination resistors R1_T, R2_T, the amplifier 100, the delay chain 200, and the latch 300 can be a conventional configuration that is well known and thus is not described in detail herein. However, the amplifier 100 can perform the equalization function when feedback data (EQ– and EQ+) have opposite logic levels, and can stop the equalization function when the feedback data EQ–, EQ+ has the same logic levels, for example, a low level. Further, depending on the conditions of the circuit design, the amplifier 100 may be designed to stop the equalization function when the feedback data EQ–, EQ+ has a high level.

The detecting unit 400 can output a section detecting signal "HZDET" when detecting a period in which data is not received by the amplifier 100, according to the level of the amplified signal "AMP_OUT". The level of an input terminal of the amplifier 100 can be maintained at a high impedance state during the period in which data is not received by the amplifier 100. Therefore, the detecting unit 400 can output the section detecting signal "HZDET" when detecting a period when data is not received, by using the amplified signal "AMP_OUT", sent from the amplifier 100, according to a high impedance state. The capacitor C1 can operate as a filter for removing a glitch that may be included in the section detecting signal "HZDET", e.g. noise, through the operation of the detecting unit 400.

Figure 3:
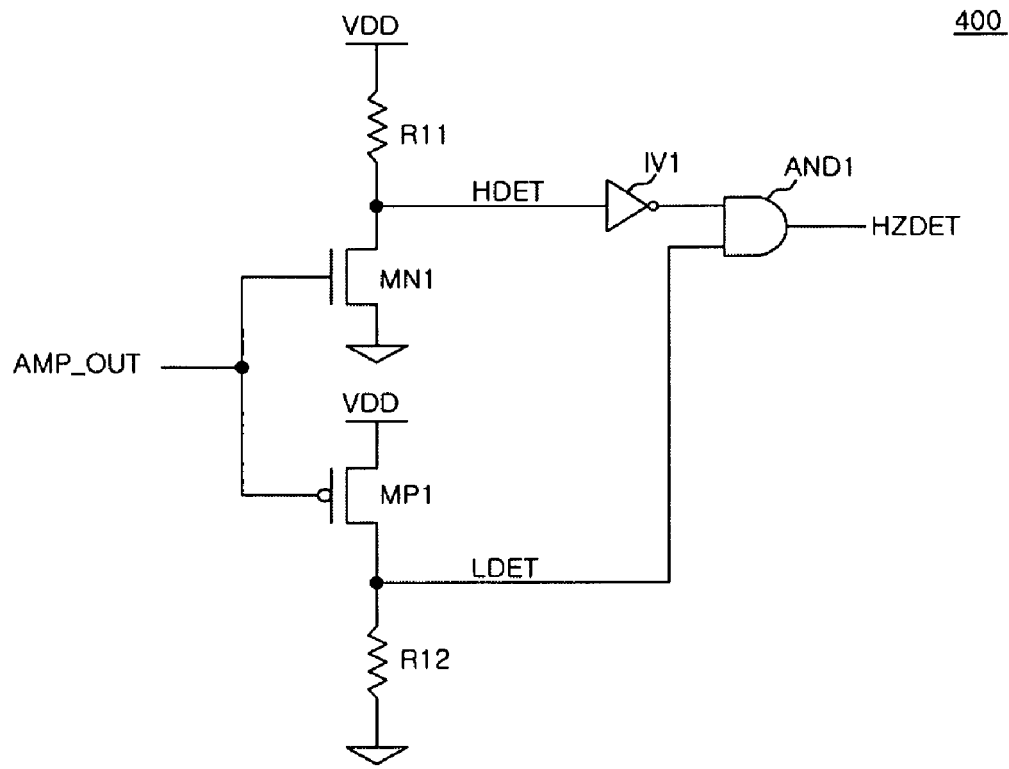
FIG. 3 is a diagram illustrating the configuration of a detecting unit that can be included in the receiver illustrated FIG. 2.

FIG. 3 is a diagram illustrating the configuration of the detecting unit 400, which can be included in the receiver, illustrated FIG. 2. Referring to FIG. 3, the detecting unit 400, can include first and second transistors MN1, MP1, first and second resistors R11, R12, an inverter IV1, and an AND gate AND1.

The first transistor MN1 can output a first data level detecting signal "HDET" at a low level, when the level of an amplified signal "AMP_OUT" is above a first voltage level, i.e. above the voltage level of (VDD_VSS)/2 at a high impedance state. The amplified signal "AMP_OUT" can be received at a gate of first transistor MN1, a ground voltage VSS can be applied to a source, and a power voltage VDD can be applied to a drain through the first resistor R11.

The second transistor MP1 can output a second data level detecting signal "LDET" at a high level when the level of an amplified signal "AMP_OUT" is less than the voltage level of (VDD−VSS)/2 at the high impedance state. The amplified signal "AMP_OUT" can be received at a gate of the second transistor MP1, a power voltage VDD can be applied to a source, and a ground voltage VSS can be applied to a drain through the second resistor R22.

The first and second transistors MN1 and MP1 can be designed to have a low threshold voltage. The first and second resistors R11 and R12 can be designed to have a high resistance value such that both of the first and second transistors, MN1 and MP1, can be turned on and low-level and high-level voltages are separately generated, at a voltage level of (VDD−VSS)/2 determined by a high impedance state. The inverter IV1 can receive the first data level detecting signal "HDET". The AND gate AND1 can output the section detecting signal "HZDET" by performing an OR operation on an output of the inverter IV1 and the second data level detecting signal "LDET".

Figure 4:
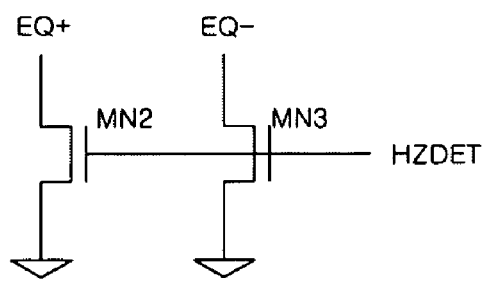
FIG. 4 is a diagram illustrating the configuration of an equalization function control unit that can be included in the receiver illustrated FIG. 2.

FIG. 4 is a diagram illustrating the configuration of the equalization function control unit 500, which can be included in the diagram, illustrated FIG. 2. Referring to FIG. 4, the equalization function control unit 500 can stop the equalization function of the amplifier 100 by changing the feedback data (EQ− and EQ+) to the level of the ground power in response to the section detecting signal "HZDET". The equalization function control unit 500 can include third and fourth transistors MN2 and MN3. The third transistor MN2 can connect a signal line, which can transmit the feedback data, e.g. EQ+, in response to the section detecting signal "HZDET", to a terminal of the ground voltage VSS. The fourth transistor MN3 can connect a signal line, which can transmit the feedback data, e.g. EQ−, in response to the section detecting signal "HZDET", to the terminal of the ground voltage VSS.

Figure 5:
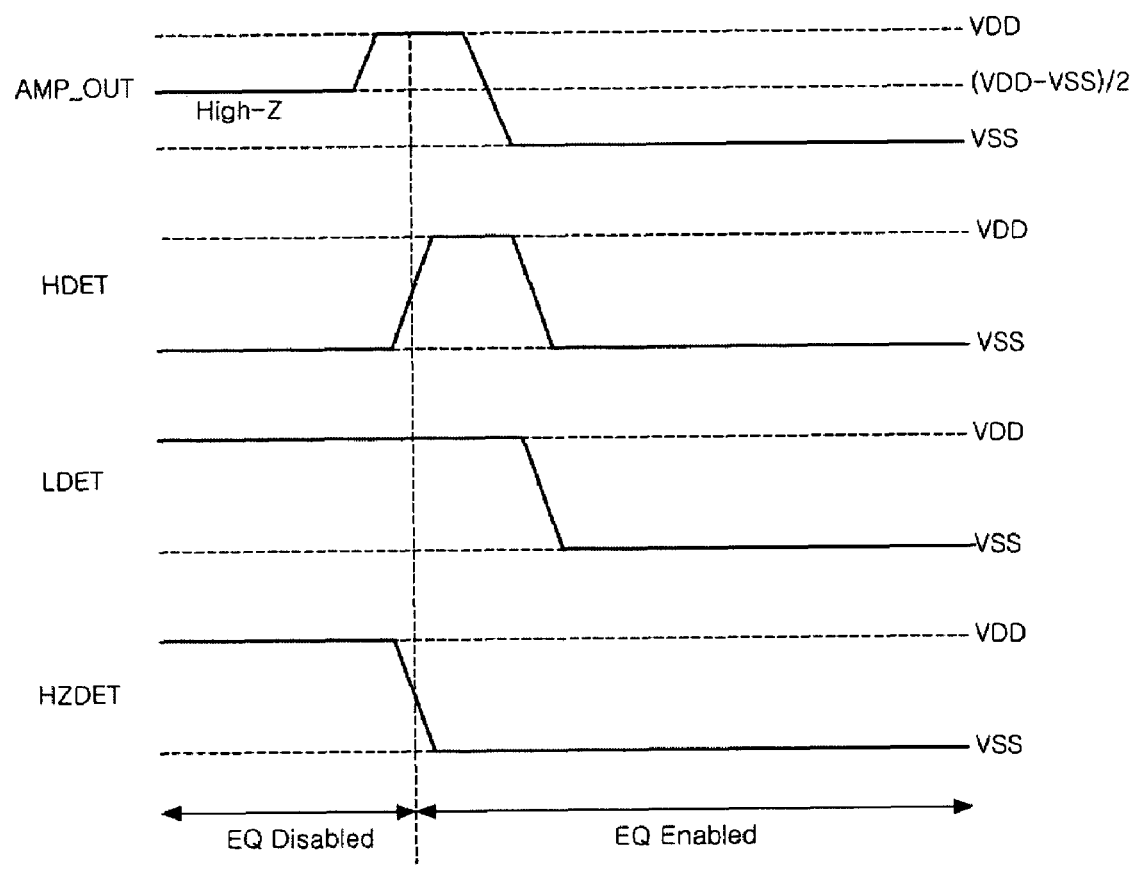
FIG. 5 is a view showing output waveforms of units in a data receiver of a semiconductor integrated circuit according to one embodiment.

FIG. 5 is a view showing output waveforms of units in a data receiver of a semiconductor integrated circuit according to one embodiment described herein. As shown in FIG. 5, the input IN of the amplifier 100 can be at the high impedance state High-Z in the period in which data is not received. Since the input IN can be at the high impedance state High-Z, the level of the amplified signal "AMP_OUT" sent from the amplifier 100 can be equal to (VDD−VSS)/2.

When the level of the amplified signal "AMP_OUT" is (VDD−VSS)/2, the first transistor MN1 of the detecting unit 400 shown in FIG. 3 can output a first data level detecting signal "HDET" at a low level and the second transistor MP1 can output a second data level detecting signal "LDET" at a high level. Since the first data level detecting signal "HDET" can be at a low level and the second data level detecting signal "LDET" can be at a high level, a section detecting signal "HZDET" can be output at a high level.

Furthermore, since the section detecting signal "HZDET" can be at a high level, both the third and fourth transistors, MN2 and MN3, of the equalization function control unit 500, shown in FIG. 4, can be turned on and change the feedback data (EQ− and EQ+) to a low level, while connecting the signal lines, which can transmit the feedback data to the terminals of the ground voltage VSS. Furthermore, as both of the feedback data is changed to a low level, the equalization function of the amplifier 100 can be stopped. That is, the equalization function of the amplifier 100 can be stopped when data is not received (EQ Disabled).

Meanwhile, once data at a specific level, e.g. high-level data, starts to be received and an amplified, signal "AMP_OUT" can be changed to a high level. Since the amplified signal "AMP_OUT" can be at a high level, i.e. at the same level as the power voltage VDD, the first transistor MN1 of the detecting unit 400, shown in FIG. 3, can output a first data level detecting signal "HDET" at a high level, and the second transistor MP1 can output a second data level detecting signal "LDET" at a high level. Since the first data level detecting signal "HDET" can be at a high level and the second data level detecting signal "LDET" can be at a high level, a section detecting signal "HZDET" can be output at a low level.

Furthermore, since the section detecting signal "HZDET" can be at a low level, the third and fourth transistors, MN2 and MN3, of the equalization function control unit 500, shown in FIG. 4, can both be turned off. In addition, since the feedback data, EQ− and EQ+, can have opposite logic levels, i.e. normal levels, the equalization of the amplifier 100 can be performed. That is, the equalization function of the amplifier 100 can be performed in a period when data is normally received (EQ Enabled). On the other hand, even if data at a low level starts to be received and an amplified signal "AMP_OUT" is changed to a low level, the equalization function of the amplifier 100 can be performed normally via the same operation as when data at a high level is received.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A data receiver of a semiconductor integrated circuit, comprising:
    an amplifier configured to output an amplified signal by detecting and amplifying received data using an equalization function according to feedback data;
    a detecting unit configured to detect a period in which data is not received in the amplifier and output a detecting signal; and
    an equalization function control unit configured to stop the equalization function of the amplifier in response to the detecting signal.

2. The data receiver of claim 1, wherein the detecting unit is configured to detect a period in which data is not received by the amplifier according to the level of the amplified signal.

3. The data receiver of claim 2, wherein the detecting unit comprises:
   a first switching element configured to output a signal at a first logic level when the level of the amplified signal is above a first voltage level;
   a second switching element configured to output a signal at a second logic level when the level of the amplified signal is less than the first voltage level; and
   a logic circuit configured to output the detecting signal by combining the output of the first switching element and the output of the second switching element.

4. The data receiver of claim 3, wherein the first voltage level includes a middle level between a power voltage level and a ground voltage level.

5. The data receiver of claim 4, wherein the first switching element is a transistor with a gate configured to receive the amplified signal, a source configured to be applied with the ground voltage, and a drain configured to be applied with the power voltage through a first resistor.

6. The data receiver of claim 4, wherein the second switching element is a transistor with a gate configured to receive the amplified signal, a source configured to be applied with the power voltage, and a drain configured to be applied with the ground voltage through a second resistor.

7. The data receiver of claim 3, wherein the logic circuit is configured to output the detecting signal by performing an AND operation on an inverted signal obtained by inverting the signal of first logic level, and the signal of second logic level.

8. The data receiver of claim 1, wherein the equalization function control unit is configured to stop an equalization function of the amplifier by controlling the level of the feedback data in response to the detecting signal.

9. The data receiver of claim 8, wherein the equalization function control unit is configured to change a voltage level of the feedback data to the ground voltage level in response to the detecting signal.

10. The data receiver of claim 9, wherein the equalization function control unit includes switching elements that connect signal lines to terminals of the ground voltage, wherein the signal lines are configured to transmit the feedback data in response to the detecting signal.

11. A method for controlling a data receiver of a semiconductor integrated circuit including an amplifier configured to output an amplified signal by detecting and amplifying received data using an equalization function according to feedback data, the method comprising:
    detecting a period in which data is not received by the amplifier; and
    controlling an equalization function of the amplifier to stop in the period when data is not received by the amplifier.

12. The method for claim 11, wherein the detecting step is achieved by using the amplified signal.

13. The method for claim 12, wherein the period when data is not received by the amplifier is a period in which the amplified signal has a level corresponding to a high impedance state.

14. The method for claim 12, wherein the period when data is not received in the amplifier is determined when the amplified signal is maintained at a middle level between the power voltage and the ground voltage is detected.

15. The method for claim 11, wherein the controlling step stops the equalization function of the amplifier by controlling the feedback data.

16. The method for claim 15, wherein the controlling step stops the equalization function of the amplifier by changing the feedback data to the ground voltage level.

\* \* \* \* \*